United States Patent [19]

Murayama et al.

[11] Patent Number: 4,930,006
[45] Date of Patent: May 29, 1990

[54] COLOR SOLID STATE IMAGE PICKUP ELEMENT WITH PLURAL PHOTOCELLS OF A SAME COLOR WITHIN A SUBUNIT THEREOF CONTROLLED BY A COMMON CONTROL LINE AND OUTPUTTING TO A COMMON SIGNAL LINE

[75] Inventors: Jin Murayama; Yoshimitsu Kudoh; Ryuji Kondo, all of Kanagawa, Japan

[73] Assignee: Fuji Photo Film Co., Ltd., Kanagawa, Japan

[21] Appl. No.: 32,644

[22] Filed: Mar. 31, 1987

[30] Foreign Application Priority Data

Mar. 31, 1986 [JP] Japan .................. 61-71299

[51] Int. Cl.⁵ .................. H04N 9/077; H04N 9/07
[52] U.S. Cl. .................. 358/44; 358/43
[58] Field of Search .................. 358/44, 41, 43, 48

[56] References Cited

U.S. PATENT DOCUMENTS

| | | | |
|---|---|---|---|
| 4,692,794 | 9/1987 | Suzuki | 358/44 |
| 4,709,259 | 11/1987 | Suzuki | 358/48 |
| 4,764,813 | 8/1988 | Murayama et al. | 358/44 |

FOREIGN PATENT DOCUMENTS 62-68372  3/1987  Japan .

*Primary Examiner*—James J. Groody
*Assistant Examiner*—Randall S. Svihla
*Attorney, Agent, or Firm*—Sughrue, Mion, Zinn, Macpeak & Seas

[57] ABSTRACT

A solid state image pickup element including: an MOS image sensor comprising: photoelectric conversion elements arranged in rows and columns; vertical selection lines extending along the rows; vertical signal lines extending along the columns; a vertical switching device associated with each photoelectric conversion element and controlled by an associated vertical selection line for selectively connecting an output of the associated photoelectric conversion element to an associated vertical signal line; a horizontal switching device associated with each column for selectively connecting an associated vertical signal line to an output line; a vertical shift register for controlling the vertical switching device through the vertical selection lines; and a horizontal shift register for controlling the horizontal switching device. The photoelectric conversion elements are divided into sets of m×n contiguous photoelectric conversion elements, and each set is divided into groups of photoelectric conversion elements. All of the photoelectric conversion elements in each group are associated with color filters having the same color; and the vertical switching devices associated with the photoelectric conversion elements in all but one of the groups selectively connect the outputs of all of the photoelectric conversion elements in a single group to one vertical signal line associated with the single group. The photoelectric conversion elements of the one group is connected to a number of vertical signal lines.

8 Claims, 2 Drawing Sheets

COLOR SOLID STATE IMAGE PICKUP ELEMENT WITH PLURAL PHOTOCELLS OF A SAME COLOR WITHIN A SUBUNIT THEREOF CONTROLLED BY A COMMON CONTROL LINE AND OUTPUTTING TO A COMMON SIGNAL LINE

BACKGROUND OF THE INVENTION

1. Field of the Invention

The present invention generally relates to a solid state image pickup element, and particularly relates to a solid state image pickup element for a color picture.

2. Background of the Invention

A solid state image pickup for a color picture typically comprises, as shown in FIG. 1, an MOS image sensor 10 constituted by photoelectric conversion elements 12 arranged in a matrix, vertical switches 14 associated with the respective photoelectric conversion elements 12, horizontal switches 16 associated with each column of the vertical switches 14, a vertical shift register 18 for controlling the vertical switches 14, and a horizontal shift register 20 for controlling the horizontal switches 16. Color filters having colors respectively corresponding to picture elements are provided over the photosensitive conversion elements 12 (and possibly covering other elements) constituting the image sensor 10.

The terms of "an image sensor" and "a solid state image pickup element" are originally used to indicate one and the same device. In this specification, however, a semiconductor element for monochromatic light is specifically referred to as "an image sensor" and an image sensor which is provided with color filters so as to be used for a color picture is referred to as "a solid state image pickup element."

In a photometric sensor for three primary colors such as red (R), green (G), and blue (B), a light reception portion is constituted by M×N multi-element units. In this case, the signals from each of those units are subject to signal processing as if each unit is located at a single respective point for the photometering although each unit is composed of an assembly of photoelectric conversion elements 12 slightly displaced from each other. Each of the units is constituted by a plurality of picture elements, each of the picture elements being provided with color filters for R, G, and B. Therefore, in each unit, a plurality of photoelectric conversion elements 12 provided for each color may collectively generate a single output. In the case where a plurality of photoelectric conversion elements 12 are provided for each color in each unit, a sum of outputs of those photoelectric conversion elements for each color is produced as a single output.

In the conventional MOS-type solid state image pickup element, as shown in FIG. 1, respective outputs of photoelectric conversion elements 12 are successively sent out and temporarily stored in a memory in an external circuit, so that a sum of the output signals for each color in each unit is formed in the external circuit.

The external circuit including the memory means is complicated in structure, requires a large number of parts, and is therefore expensive.

If the photoelectric conversion elements 12 in each of units are suitably adjusted in shape and size thereof so as to put weights on signals of the respective colors, on the other hand, it becomes unnecessary to provide a plurality of photoelectric conversion elements for each of the colors. This arrangement, however, has difficulties in manufacturing, resulting in increase in cost similarly to the foregoing cases.

SUMMARY OF THE INVENTION

It is therefore an object of the present invention to eliminate the foregoing disadvantages in the prior art.

It is another object of the present invention to improve a solid state image pickup element for a color picture provided with a plurality of photoelectric conversion elements for each color in each unit so that a sum of output signals for each of the colors can be formed without using any memory and any other external circuit.

In order to attain the foregoing objects, the solid state image pickup element according to the present invention is characterized in that each set of m×n adjacent ones of the photoelectric conversion elements form one unit, where m and n are positive integers greater than one. Each set of m×n photoelectric conversion elements is divided into l groups corresponding to respective l colors of the color filters. The vertical switching devices associated with the photoelectric conversion elements in each of the groups are arranged to be controlled by the same vertical selection line. Respective outputs of the vertical switching devices belonging to each of the groups are connected to the same vertical signal line so as to form a sum of the outputs of the photoelectric conversion elements for each color.

In the solid state image pickup element according to the present invention, the photoelectric conversion elements arranged in a matrix are made up into units such that each unit is composed of m×n, for example, 3×3=9 photoelectric conversion elements. In each unit, a filter for each of the colors, for example, each of the three primary colors such as R, G, and B, is associated with each of these nine photoelectric conversion elements of the unit. In each unit, the filter colors associated with the photoelectric conversion elements may be arranged as desired. Further, it is not necessary to assign the colors to the nine photoelectric conversion elements with a correspondence of one-to-three. More photoelectric conversion elements may be assigned to a certain one of the colors than other ones in accordance with weighting applied to the color signals.

In each unit, the photoelectric conversion elements are divided into three sets corresponding to the three colors. In each of the sets, the vertical switching devices associated with the photoelectric conversion elements in the set are simultaneously controlled by the the same vertical selection line for the set. At this time, the respective outputs of the vertical switching devices of the set are all connected to a vertical signal line, a sum of the outputs of a plurality of the photoelectric conversion elements of the set appears on the vertical signal line.

The above objects, features, and advantages of the present invention will be apparent from the following detailed description taken in conjunction with the accompanying drawing.

DETAILED DESCRIPTION OF THE PREFERRED EMBODIMENTS

Figure 1:
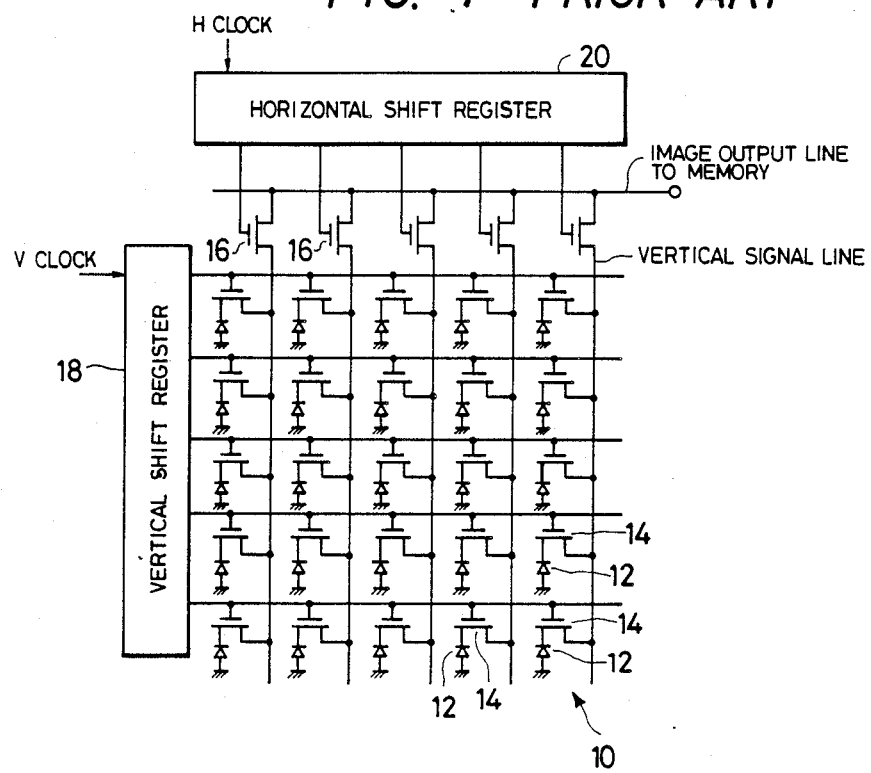
FIG. 1 shows a part of the conventional solid state image pickup element.
Figure 2:
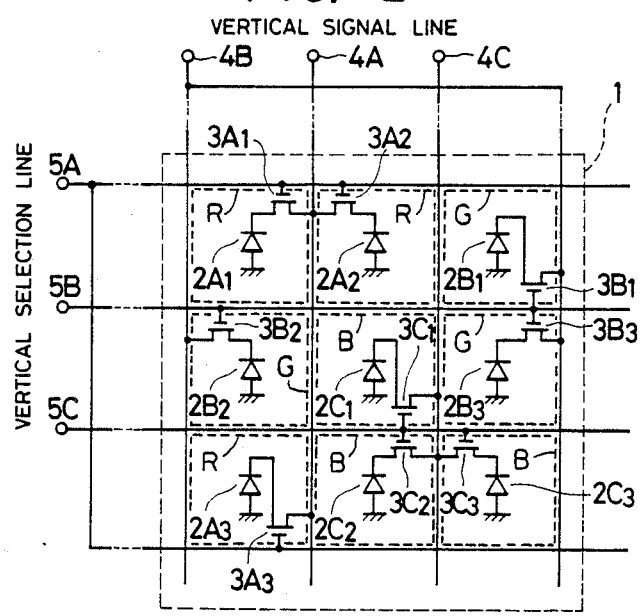
FIG. 2 schematically shows a part of the solid state image pickup element according to the present invention.

Referring to FIG. 2, an embodiment of the solid state image pickup element according to the present invention will be described hereunder.

FIG. 2 conceptually and schematically shows photoelectric conversion elements $2A_1$, $2A_2$, $2A_3$, etc. arranged in a matrix, and a part of its peripheral circuit. The illustrated part corresponds to one unit 1 which is processed as if it is one and the same point for photometering. In the illustrated embodiment, the unit 1 is $3 \times 3$, that is, contains 9 photoelectric conversion elements $2A_1$, $2A_2$, $2A_3$, $2B_1$, $2B_2$, $2B_3$, $2C_1$, $2C_2$, and $2C_3$.

Color filters or microfilters R, G, and B are disposed on each of the photoelectric conversion elements or photocells $2A_1$, $2A_2$, etc. so that each of the photoelectric conversion elements $2A_1$, $2A_2$, etc. receives only one of three primary colors, R, G, and B. A matrix of microfilters R, G and B form a mosaic color filter. The photoelectric conversion elements $2A_1$, $2A_2$, etc. are divided into groups A, B, and C, corresponding to each received color. In this embodiment, each of the groups A, B, and C includes three photoelectric conversion elements. That is, the group A includes the photoelectric conversion elements $2A_1$, $2A_2$, and $2A_3$, assigned to the color R, the group B includes the photoelectric conversion elements $2B_1$, $2B_2$, and $2B_3$, assigned to the color G and the group C includes the photoelectric elements $2C_1$, $2C_2$, and $2C_3$ assigned to the color B.

The photoelectric conversion elements $2A_1$, $2A_2$, and $2A_3$; $2B_1$, $2B_2$, and $2B_3$; and $2C_1$, $2C_2$, and $2C_3$ are respectively and corresponding provided with vertical switching devices $3A_1$, $3A_2$, and $3A_3$; $3B_1$, $3B_2$, and $3B_3$; and $3C_1$, $3C_2$, and $3C_3$. The respective gates of the A-group vertical switching devices $3A_1$, $3A_2$, and $3A_3$ are connected to the same vertical selection line 5A. The respective gates of the B-group vertical switching devices $3B_1$, $3B_2$, and $3B_3$ are connected to the same vertical selection line 5B; and the respective gates of the C-group vertical switching devices $3C_1$, $3C_2$, and $3C_3$ are connected to the same vertical selection line 5C. Therefore, the vertical switching devices in each group, for example, the vertical switching devices $3A_1$, $3A_2$, and $3A_3$ in the group A, are simultaneously opened/closed. At this time, since the respective drains of the vertical switching devices in each group is connected to the same vertical signal line, the sum of the respective outputs of the photoelectric conversion elements belonging to the group is generated on the vertical signal line. That is, for example, the respective drains of the vertical switching devices $3A_1$, $3A_2$, and $3A_3$ in the group A are connected to the same vertical signal line 4A, so that the sum of the respective outputs of the photoelectric conversion elements $2A_1$, $2A_2$, and $2A_3$ constituting the group A is generated on the vertical signal line 4A. This applies to the other groups B and C.

Figure 3:
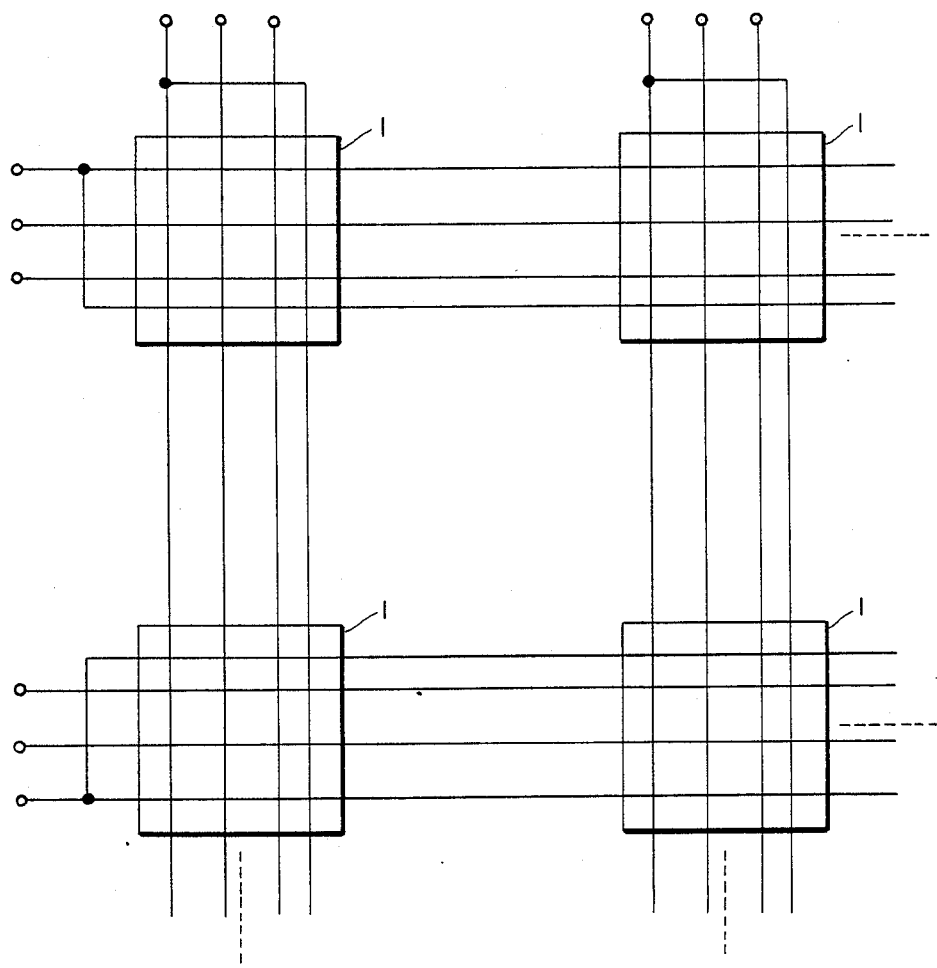
FIG. 3 schematically shows all of the solid state image pickup element of FIG. 2.

The vertical selection lines 5A, 5B, and 5C for the unit 1 of concern and other vertical selection lines for other matrix-arranged units 1 (not shown) are connected to corresponding output terminals at stages of the vertical shift register 18. The vertical signal lines 4A, 4B, and 4C for the unit 1 of concern and other vertical signal lines for other units (not shown), on the other hand, are connected to corresponding horizontal switching devices 16 controlled by corresponding output terminals of the horizontal shift register 20 so that the vertical signal lines are gated by the horizontal shift register 20. In this case, it should be apparent that it is sufficient for the operation that either of the vertical and horizontal shift registers is provided with three stages for every unit and the other one is provided with one stage for each unit. FIG. 3 shows a plurality of units 1 of FIG. 2. In FIG. 3, the plurality of units 1 can be considered a matrix of photocells and each unit 1 can be considered a submatrix of $m \times n$ adjacent ones of the photocells. In the solid state image pickup element which has been proposed in Japanese Pat. Application No. 206256/1985 by the inventor of this application, a vertical shift register is constituted by a plurality of shift registers. If the shift register provided with three stages for every unit is arranged to generate pulses of different widths from each stage, it is possible to thereby assign weights different from each other on the three colors. Further, if an arrangement is made such that openings of a light shielding layer are made different from each other for the respective photoelectric conversion elements, it is possible to put weights different from each other on the three colors even when equal width pulses are applied to the switching devices respectively.

In the solid state image pickup element according to the present invention, it is possible to form a sum of signals of the same color by providing various weights without using any memory and any external circuit. Further, the arrangement of the solid state image pickup element according to the present invention is made simple in comparison with that of the conventional one, so that the operation of the invention can be accurately performed and the cost can be reduced. Moreover, the solid state image pickup element according to the present invention is exceedingly useful for photometering because the R, G, and B signals in one and the same unit can be treated independently of each other.

What is claimed is:
1. A solid state image pickup element comprising:
an MOS image sensor comprising:
photoelectric conversion elements arranged in rows and columns;
vertical selection lines extending along the rows;
vertical signal lines extending along the columns;
a vertical switching means associated with each photoelectric conversion element and controlled by an associated vertical selection line for selectively connecting an output of the associated photoelectric element to an associated vertical signal line;
a horizontal switching means associated with each column for selectively connecting an associated vertical signal line to an output line;
a vertical shift register for controlling the vertical switching means through the vertical selection lines; and
a horizontal shift register for controlling the horizontal switching means;
the solid state image pickup element further comprising a color filter having one of l colors associated with each photoelectric conversion element; wherein
the photoelectric conversion elements are divided into sets of $m \times n$ contiguous photoelectric conversion elements, m and n being integers greater than one;
each set is divided into l groups of photoelectric conversion elements, wherein all of the photoelectric conversion elements in each group are associated with color filters having the same color; and the vertical switching means associated with the photoelectric conversion elements in each group except one selectively connect the outputs of all of the photoelectric conversion elements in the group to one vertical signal line associated with the group, thereby producing a sum of the outputs of all of the photoelectric conversion elements in the group on the one vertical signal line, and the vertical switching means associated with the photoelectric conversion elements of said one group selectively connect the outputs of all of the photoelectric conversion elements in said one group to a plurality of vertical signal lines associated with said one group, thereby producing a sum of the outputs of all of the photoelectric conversion elements in said one group on the plurality of vertical signal lines.

2. A solid state image pickup element as recited in claim 1, wherein $l=3$.

3. A solid state image pickup element as recited in claim 2, wherein $m=n=3$.

4. A solid state image pickup element as recited in claim 3, wherein within each set, two rows and two columns each contain one pair of contiguous photoelectric conversion elements belonging to the same group.

5. A solid state image pickup element as recited in claim 3, wherein at most only four vertical selection lines extend through any of said sets and at most only four vertical signal lines extend through any of said sets.

6. A solid state image pickup element as recited in claim 1, wherein only $l+1$ vertical signal lines extend through any of said sets.

7. A solid state image pickup element comprising:
a mosaic color filter comprising microfilters arranged in rows and columns, each of said microfilters being one of l colors; and
an MOS image sensor comprising:
photocells arranged in rows and columns and corresponding to said microfilters, said microfilters being superposed above said photocells;
vertical selection lines extending along the rows;
vertical signal lines extending along the columns;
a vertical switching means associated with each photocell and controlled by an associated vertical selection line for selectively connecting an output of the associated photocell to an associated vertical signal line;
a horizontal switching means associated with each column for selectively connecting an associated vertical signal line to an output line;
A vertical shift register for controlling the vertical switching means through the vertical selection lines; and
a horizontal shift register for controlling the horizontal switching means;
the photocells being divided into sets of $m \times n$ contiguous photocells, m and n being integers greater than one;
each set is divided into l groups of photocells, wherein all of the photocells in each group are superposed by microfilters having the same color;
the vertical switching means associated with the photocells in each group except one selectively connect the outputs of all of the photocells in the group to one vertical signal line associated with the group, thereby producing a sum of the outputs of all of the photocells in the group on the one vertical signal line, and the vertical switching means associated with the photocells of the one group selectively connect the outputs of all of the photocells in said one group to a plurality of vertical signal lines associated with said one group, thereby producing a sum of the outputs of all of the photocells in said one group on the plurality of vertical signal lines.

8. A solid state image pickup element as recited in claim 7, wherein only $l=1$ vertical signal lines extend through any of said sets.

* * * * *